United States Patent
Goma et al.

(10) Patent No.: US 9,786,705 B2
(45) Date of Patent: Oct. 10, 2017

(54) SOLID STATE IMAGE SENSOR WITH EXTENDED SPECTRAL RESPONSE

(71) Applicant: QUALCOMM Incorporated, San Diego, CA (US)

(72) Inventors: Sergiu Radu Goma, San Diego, CA (US); Biay-Cheng Hseih, Irvine, CA (US); Todor Georgiev Georgiev, Sunnyvale, CA (US)

(73) Assignee: QUALCOMM Incorporated, San Diego, CA (US)

(*) Notice: Subject to any disclaimer, the term of this patent is extended or adjusted under 35 U.S.C. 154(b) by 46 days.

(21) Appl. No.: 15/057,818

(22) Filed: Mar. 1, 2016

(65) Prior Publication Data

US 2017/0179177 A1    Jun. 22, 2017

Related U.S. Application Data

(60) Provisional application No. 62/270,547, filed on Dec. 21, 2015.

(51) Int. Cl.
*H01L 27/146* (2006.01)
*H04N 5/369* (2011.01)
*H04N 5/33* (2006.01)

(52) U.S. Cl.
CPC .. *H01L 27/14623* (2013.01); *H01L 27/14621* (2013.01); *H01L 27/14627* (2013.01);
(Continued)

(58) Field of Classification Search
CPC ......... H01L 27/14623; H01L 27/14627; H01L 27/14636; H01L 27/14685; H01L 27/14621; H04N 5/332; H04N 5/369
(Continued)

(56) References Cited

U.S. PATENT DOCUMENTS 8,507,964 B2    8/2013    Nozaki et al.
8,900,912 B2    12/2014   Chen et al.
(Continued)

FOREIGN PATENT DOCUMENTS

EP    2879181 A1    6/2015
WO    WO-2015119186 A1    8/2015
WO    WO-2015146253 A1    10/2015

OTHER PUBLICATIONS

International Search Report and Written Opinion—PCT/US2016/064000—ISA/EPO—Feb. 20, 2017.

*Primary Examiner* — Bo Fan
(74) *Attorney, Agent, or Firm* — Knobbe, Martens, Olson & Bear, LLP

(57) ABSTRACT

Various embodiments are directed to an image sensor that includes a first sensor portion and a second sensor portion coupled to the first sensor portion. The second sensor portion may be positioned relative to the first sensor portion so that the second sensor portion may initially detect light entering the image sensor, and some of that light passes through the second sensor portion and is be detected by the first sensor portion. In some embodiments, the second sensor portion may be configured to have a thickness suitable for sensing visible light. The first sensor portion may be configured to have a thickness suitable for sensing IR or NIR light. As a result of the arrangement and structure of the second sensor portion and the first sensor portion, the image sensor captures substantially more light from the light source.

30 Claims, 12 Drawing Sheets

(52) U.S. Cl.
CPC .. *H01L 27/14636* (2013.01); *H01L 27/14685* (2013.01); *H04N 5/332* (2013.01); *H04N 5/369* (2013.01)

(58) Field of Classification Search
USPC ...... 438/69, 190; 348/47, 164; 257/292, 432
See application file for complete search history.

(56) References Cited

U.S. PATENT DOCUMENTS

| | | | |
|---|---|---|---|
| 8,947,572 B2 | 2/2015 | Venezia et al. | |
| 9,698,191 B2* | 7/2017 | Hseih | H01L 27/14649 |
| 2010/0065896 A1 | 3/2010 | Lee et al. | |
| 2013/0075607 A1* | 3/2013 | Bikumandla | H01L 27/14632 |
| | | | 250/332 |
| 2013/0234029 A1* | 9/2013 | Bikumandla | H01L 25/043 |
| | | | 250/349 |
| 2015/0054962 A1* | 2/2015 | Borthakur | H04N 5/332 |
| | | | 348/164 |
| 2015/0091124 A1 | 4/2015 | Liu et al. | |
| 2015/0381965 A1* | 12/2015 | Atanassov | H04N 5/23245 |
| | | | 348/47 |
| 2016/0322412 A1* | 11/2016 | Yamamoto | H01L 27/14621 |
| 2017/0053964 A1* | 2/2017 | Hseih | H01L 27/14627 |

* cited by examiner

SOLID STATE IMAGE SENSOR WITH EXTENDED SPECTRAL RESPONSE

RELATED APPLICATIONS

This application claims priority under 35 U.S.C. §119 to Provisional Application No. 62/270,547 entitled "SOLID STATE IMAGE SENSOR WITH EXTENDED SPECTRAL RESPONSE," filed Dec. 21, 2015, the contents of which is expressly incorporated by reference in its entirety.

BACKGROUND

Field of Invention

This disclosure relates to an image sensor, and specifically to an image sensor having an extended spectral range.

Description of Related Technology

Image processing devices, such as digital cameras, smartphones or tablet computers, rely on image sensors to capture images. Image sensors receive light and convert that light into electrical signals. The image processing devices then transform these electrical signals into digital images.

Different types of image sensors are currently available. For example, image processing devices typically utilize either a frontside-illumination (FSI) image sensor or a backside-illumination (BSI) image sensor. An FSI image sensor is typically oriented such that light enters the top of the FSI image sensor and passes through a metal-interconnect layer before striking the light-sensing surface. In contrast, BSI image sensors are oriented to allow light to enter from the top of the BSI image sensor and to strike a light-sensing surface without passing through the metal/wiring layer of the BSI wafer. While each of the FSI and BSI image sensors have favorable imaging characteristics, they both may have limited spectral responses. Accordingly, there is a need for an image sensor having a greater spectral response than either a FSI or BSI image sensor.

SUMMARY OF THE INVENTION

The systems, methods, and devices of the invention each have several aspects, no single one of which is solely responsible for its desirable attributes. Without limiting the scope of this invention as expressed by the claims which follow, some features will now be discussed briefly.

Various embodiments include a method for assembling an image sensor. In some embodiments, the method may include forming a first metal-interconnect layer on a first sensor portion, forming a second metal-interconnect layer on a second sensor portion, forming a first light pipe within the first metal-interconnect layer, forming a second light pipe within the second metal-interconnect layer, positioning the first sensor portion relative to the second sensor portion such that the first light pipe and the second light pipe are aligned and oriented about a common axis, and bonding the first metal-interconnect layer with the second metal-interconnect layer.

In some embodiments, the method may further include coupling a color filter to the second sensor portion and coupling a micro-lens to the color filter. In some embodiments, bonding the first metal-interconnect layer with the second metal-interconnect layer may cause the first light pipe and the second light pipe to form a cavity about the common axis. In some embodiments, the cavity may be configured to enable light to pass from the second photodetector, through a combined metal-interconnect layer that includes the first metal-interconnect layer and the second metal-interconnect layer, and to the first photodetector. In some embodiments, bonding the first metal-interconnect layer with the second metal-interconnect layer may further include bonding the first light pipe with the second light pipe. In some embodiments, a thickness of the first sensor portion may be at least seven micrometers.

In some embodiments, the method may further include reducing a thickness of the second sensor portion such that the reduced thickness of the second sensor portion enables infrared or near-infrared light to pass through the second sensor portion. The thickness of the second sensor portion may also be reduced to between three micrometers and five micrometers, inclusive.

In some embodiments, forming the first light pipe may include forming the first light pipe in the first metal-interconnect layer with respect to a photodetector embedded in the first sensor portion, and forming the second light pipe may include forming the second light pipe in the second metal-interconnect layer with respect to a photodetector embedded in the second sensor portion. Further, positioning the first sensor portion in relation to the second sensor portion may further include aligning the photodetector of the first sensor portion with the photodetector of the second sensor portion.

Various embodiments may include an image sensor that includes a first sensor portion and a second sensor portion coupled to the first sensor portion. In some embodiments, the first sensor portion may include a first photodetector, a first metal-interconnect layer, and a first light pipe. In such embodiments, the second sensor portion may include a second photodetector, a second metal-interconnect layer, and a second light pipe. As such, the first metal-interconnect layer may be bonded to the second metal-interconnect layer to form a combined metal-interconnect layer.

In some embodiments, a thickness of the first sensor portion may be at least seven micrometers. In some embodiments, a thickness of the second sensor portion may be no more than five micrometers. In some embodiments, the image sensor may also include a color filter and a micro-lens. In some embodiments, the first light pipe may be formed within the first metal-interconnect layer, and the second light pipe may be formed within the second metal-interconnect layer.

In some embodiments, the first metal-interconnect layer may be bonded to the second metal-interconnect layer such that the first photodetector aligns with the second photodetector about a common axis. The first light pipe may also be aligned with the second light pipe about the common axis.

In some embodiments, the first light pipe may be positioned with respect to the second light pipe to form a cavity within the combined metal-interconnect layer between the first photodetector and the second photodetector. The cavity may be configured to allow light to pass from the second photodetector of the second sensor portion, through the combined metal-interconnect layer, and to the first photodetector of the first sensor. In some embodiments, the light may originate from a common direction. The light may also include at least one of near-infrared light or infrared light.

In some embodiments, the first sensor image may further include a first plurality of epitaxial layers, and each epitaxial layer of the first plurality of epitaxial layers may have a distinct doping concentration. Further, the first plurality of epitaxial layers may be arranged within the first sensor portion based on respective doping concentrations of the first plurality of epitaxial layers.

In some embodiments, the second sensor portion may also include a second plurality of epitaxial layers, and each epitaxial layer of the second plurality of epitaxial layers may have a distinct doping concentration. Further, the second plurality of epitaxial layers may be arranged within the second sensor portion based on respective doping concentrations of the second plurality of epitaxial layers, and an arrangement of the second plurality of epitaxial layers within the second sensor portion may be inverse of an arrangement of the first plurality of epitaxial layers within the first sensor portion.

Various embodiments may include an image processing device. In some embodiments, the image processing device may include an image sensor that includes a first portion, a second portion, and a combined metal-interconnect layer. The image processing device may also include a memory and a processor coupled to the memory and coupled to the image sensor. The first portion of the image sensor may include a first photodetector and a first light pipe. The second portion of the image sensor may include a second photodetector aligned with the first photodetector about a common axis and a second light pipe positioned in relation to the first light pipe. The combined metal-interconnect layer may be coupled to the first portion of the image sensor and to the second portion of the image sensor. In some embodiments, the first photodetector may be configured to receive at least a first portion of light from a light source, and the second photodetector may be configured to receive at least a second portion of the light from the light source.

In some embodiments, the first photodetector may be configured to convert the first portion of light into a first electrical signal, the second photodetector may be configured to convert the second portion of the light into a second electrical signal, and the combined metal-interconnect layer may be configured to drive the first electrical signal and the second electrical signal to the processor. In some embodiments, the image sensor may be arranged such that, when the second portion of the image sensor is proximal to the light source, the at least second portion of the light passes through the second portion of the image sensor before the at least first portion of the light passes through the first portion of the image sensor. In some embodiments, the first portion of the light may include at least one of infrared light or near-infrared light, and the second portion of the light may include visible light.

In some embodiments, the memory may include processor-executable instructions that, when executed by the processor, cause the processor to perform operations that include generating a first digital signal from the first electrical signal, generating a second digital signal from the second electrical signal, and generating a combined digital signal from the first digital signal and the second digital signal. In some embodiments, the memory may include processor-executable instructions that, when executed by the processor, cause the processor to perform operations that further include generating a digital image based at least in part on the combined digital signal.

BRIEF DESCRIPTION OF THE DRAWINGS

The foregoing aspects and many of the attendant advantages will become more readily appreciated as the same become better understood by reference to the following detailed description, when taken in conjunction with the accompanying drawings, wherein.

DETAILED DESCRIPTION

Figures 1A, 1B:
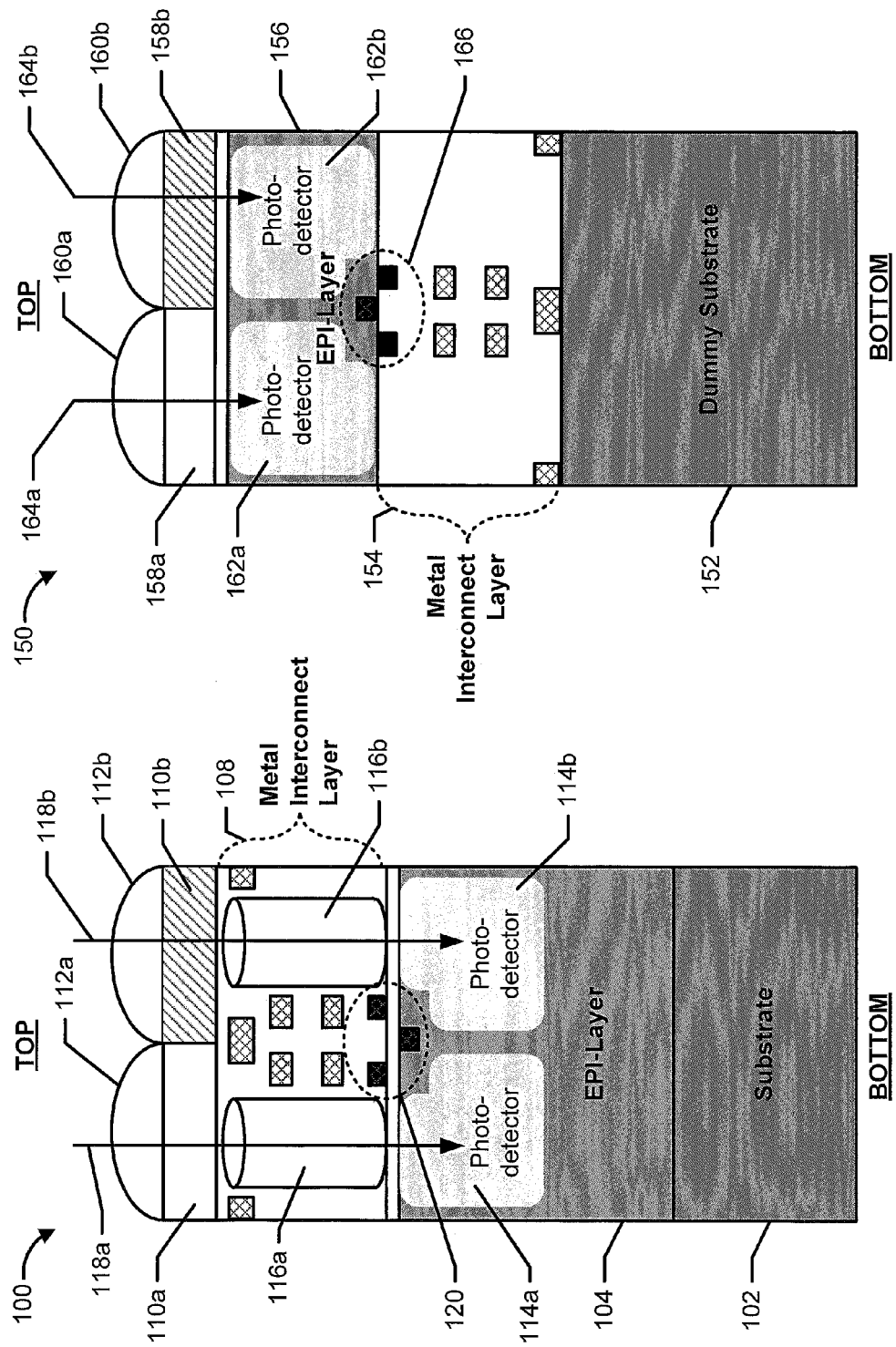
FIG. 1A is a component diagram showing a cross-section view of a frontside-illuminated image sensor.
FIG. 1B is a component diagram showing a cross-section view of a backside-illuminated image sensor.

As described herein, some components of an image sensor (e.g., an FSI or BSI image sensor) may sometimes be referred to as positioned "above," "on top of," "underneath," "below," or similar terminology in relation to some other components. For ease of description, spatial relations between components in an image sensor may be described in relation to the "top" and "bottom" of the image sensor. In some embodiments, the "top" of an image sensor may correspond with the point at which light initially enters the image sensor. Accordingly, the "bottom" of the image sensor may be on the opposite side of the image sensor than the top of the image sensor. Thus, a first component of an image sensor that is closer to the top of the image sensor than a second may be described as being "on top of" or "above" the second component.

The terms "sensor element" is used herein to refer to a basic component of an image sensor that is configured to capture light information. Specifically, a sensor element may be configured to capture a portion of a photographic object such that a representation of the entire photographic image (or a larger portion) may be captured using multiple sensor elements of the image sensor. An image sensor may be described as including or having one or more sensor elements arranged as a two-dimension array or matrix. This two-dimensional array may correspond with a particular resolution of a related digital image, and more sensor elements typically correspond with higher-resolution digital images. For example, an image processing device (e.g., a digital camera) with an image sensor having a 640×480 array of sensor elements (e.g., a 0.3 megapixel image sensor) may capture lower resolution digital images than another image processing device with an image sensor having a 4000×3000 array of sensor elements (e.g., a 12 megapixel image sensor). Any reference to an image sensor having a certain number of sensor elements is simply for ease of description and is not intended to limit any image sensor to have any particular number of sensor elements, unless otherwise indicated.

As noted above, the silicon wafers used in a conventional backside-illumination (BSI) image sensor may be ground to be thin enough such that light enters from the front of the BSI wafer and strikes a light receiving surface without passing through the metal/wiring layer of the BSI image sensor. Because light does not pass through the wiring in a BSI wafer, light is not scattered or obstructed to the same degree as observed in frontside-illumination (FSI) image sensors. Thus, BSI image sensors generally experience better performance when detecting visible light than FSI image sensors. However, because BSI image sensors are thinner than FSI wafers (e.g., less than three micrometers versus greater than seven micrometers, respectively), BSI image sensors do not detect near-infrared ("NIR") or infrared ("IR") light as well as FSI image sensors due to the relatively longer wavelengths of NIR/IR light.

In overview, various embodiments provide for an image sensor configured to sense visible light on par with a BSI image sensor, while at the same time also being configured to sense IR or NIR light as well as an FSI image sensor. In such embodiments, the image sensor may include a first sensor portion (which may also be referred to as a first image sensor) configured to function similar to an FSI image sensor within the image sensor. Further, the image sensor may include a second sensor portion (which may be referred to as a second image sensor) configured to function similar to a BSI image sensor and coupled to the first sensor portion. In various embodiments, the image sensor may be configured such that the second sensor portion is positioned on top of the first sensor portion, "top" being used refer to a position such that light may enter the second sensor portion and be detected, and some of that light may pass through the second sensor portion and may be detected with the first sensor portion. In some embodiments, the second sensor portion may be configured to have a thickness suitable for sensing visible light, such as by performing wafer thinning or grinding. The first sensor portion may be configured to have a thickness suitable for sensing IR or NIR light, which may not require wafer grinding or may require a lesser degree of grinding. By positioning the second sensor portion above the first sensor portion such that each image sensor is able to capture some light from the same source (e.g., from the same direction), the overall light captured by the image sensor may be improved. Various embodiments further relate to methods for fabricating such an image sensor.

In some embodiments, the first sensor portion and the second sensor portion of the image sensor may have one or more sensor elements. The first sensor portion and the second sensor portion may be physically coupled or affixed together in such a way that each sensor element of the first sensor portion is aligned with a corresponding sensor element of the second sensor portion. Specifically, each sensor element of the first sensor portion may be positioned below a corresponding sensor element of the second sensor portion. In an example in which each of the first sensor portion and the second sensor portion has two sensor elements (e.g., a 2×1 sensor array), a first sensor element of the first sensor portion may be aligned with a corresponding first sensor element of the second sensor portion, and a second sensor element of the first sensor portion may be aligned with a second corresponding sensor element of the second sensor image.

In some embodiments, the alignment of sensor elements of the first and second sensor portions may include aligning photodetectors and light pipes in the first and second sensor portions of the image sensor (e.g., as discussed with reference to FIG. 2), which may ensure that light from the same source is captured or sensed by corresponding sensor elements in the image sensor. In such embodiments, this configuration of the image sensor may enable a photodetector in the second sensor portion to receive visible light from a source and may also enable a corresponding photodetector in the first sensor portion to receive NIR or IR light from the same source. The configuration and alignment of the first and second sensor portions of the image sensor facilitates the capture of light from the same source using two sets of photodetectors, and as a result, the digital images created from the light captured with these photodetectors may have a higher degree of detail, especially in low-light situations.

In some embodiments, the first sensor portion and the second sensor portion of the image sensor may be physically coupled or affixed together by bonding the metal-interconnect layers of each of the first and second sensor portions into an metal-interconnect layer. For example, the metal-interconnect layers of the first and second sensor portions may be coupled by applying a metal-oxide adhesive. In such embodiments, photodetectors in both of the first and second sensor portions may share the combined metal-interconnect layer to send electrical signals generated from captured light to imaging processing components coupled to the image sensor.

In embodiments described herein, certain references to an image sensor as having a "first sensor portion" (or a "first image sensor") or a "second sensor portion" (or a "second image sensor") is merely for ease of labeling and description. As such, the description of an image sensor as a "first sensor portion" or a "second image sensor" is not intended to be limiting.

Various embodiments will be described in detail with reference to the accompanying drawings. Generally, the same reference numbers will be used throughout the drawings to refer to the same or like part. References made to particular examples and implementations are for illustrative purposes, and are not intended to limit the scope of the invention or the claims.

FIG. 1A is a side view of a cross-section of an example of an embodiment of an FSI image sensor 100 that illustrates certain features. In this example, the FSI image sensor 100 includes a substrate layer 102, an epitaxial layer 104, a metal-interconnect layer 108, one or more color filters (e.g., color filters 110a and 110b), and one or more micro-lenses (e.g., micro-lenses 112a and 112b).

The FSI image sensor 100 is oriented such that light (e.g., light 118a or 118b) enters from the top of the FSI image sensor 100. In the example illustrated in FIG. 1A, light 118a or 118b enters the FSI image sensor 100 via the micro-lenses 112a and 112b, which focus the light 118a or 118b. The light 118a and 118b then passes through the color filters 110a-b. In particular, the color filters 110a and 110b block light in certain wavelengths (e.g., certain colors) so that light that passes through the color filters may have a particular color or may be associated with a particular range of wavelengths or colors.

After being focused by the micro-lenses 112a and 112b and filtered by the color filters 110a and 110b, the light 118a or 118b passes through the metal-interconnect layer 108— usually through one or more light pipes 116a and 116b—to be received by the photodetectors 114a and 114b included in the epitaxial layer 104. The light pipes 116a and 116b may be embedded in the metal-interconnect layer 108 and may facilitate the passage of the light 118a and 118b through the metal-interconnect layer 108 by restricting the light to within the light pipes 116a and 116b. As a result, portions of the light 118a and 118b may avoid passing directly through the metal-interconnect layer 108, which may otherwise cause some of the light 118a and 118b to be scattered or obstructed, as noted above.

After passing through the light pipes 116a and 116b, the light 118a and 118b strikes the photodetectors 114a and 114b, which may be configured to detect the light 118a and 118b. The photodetectors 114a and 114b convert the light energy of the light 118a and 118b into electrical energy. This electrical energy is passed to the metal-interconnect layer 108 via a metal-oxide-semiconductor field-effect transistor (e.g., MOSFET 120), which drives the electrical energy to one or more processors or other components (not shown) that convert the electrical energy into a digital signal that may be combined with other digital signals to form a digital image. Generally described, each of the photodetectors 114a and 114b may correspond with a different sensor element in the FSI image sensor 100. As such, the FSI image sensor 100 illustrated in FIG. 1A may be characterized as showing two sensor elements corresponding to the photodetectors 114a and 114b.

The photodetectors 114a and 114b are included or embedded in an epitaxial layer 104. The epitaxial layer 104 is typically made from gallium nitride, or some combination of gallium, indium, aluminum, nitrogen, phosphorus, or arsenic. In the example illustrated in FIG. 1A, the epitaxial layer 104 is formed on top of the substrate layer 102 through the process of epitaxy growth from the substrate layer 102. The substrate layer 102 may be made from various semiconductor materials, such as crystalline silicon. In some instances, the epitaxial layer 104 is made from the same or another material as the substrate layer 102. In some instances, the epitaxial layer 104 may be a boron-doped, p-type semiconductor material.

FIG. 1B is a side view of a cross-section of an example of an embodiment of a BSI image sensor 150 that illustrates certain features. In the illustrated example, the BSI image sensor 150 includes a dummy substrate layer 152, a metal-interconnect layer 154, an epitaxial layer 156, one or more color filters 158a and 158b, and one or more micro-lenses 160a and 160b. These components of the BSI image sensor 150 may be similar to and may be used for similar purposes to the components described with reference to the FSI image sensor 100. However, unlike FSI image sensors (e.g., the FSI image sensor 100) that require light to pass through a metal-interconnect layer, the BSI image sensor 150 may be configured to sense light without the light passing through the metal-interconnect layer 154.

Specifically, in the example illustrated in FIG. 1B, light 164a and 164b may be received from the top of the BSI image sensor 150. As described with reference to the FSI image sensor 100, the light 164a and 164b may pass, respectively, through the micro-lenses 160a and 160b, which may focus the light 164a and 164b, and through color filters 158a and 158b, which may filter out certain colors or wavelengths in the light 164a and 164b. However, in contrast to the above description of the FSI image sensor 100, the light may pass through the color filters 158a and 158b and may be received by the photodetectors 162a and 162b embedded in the epitaxial layer 156. As such, the light 164a and 164b may be sensed by the photodetectors 162a and 162b without having to pass through a metal-interconnect layer 154, which may be positioned underneath the epitaxial layer 156 and may be in electrical contact with the epitaxial layer 156 via a MOSFET 166.

The epitaxial layer 156 of the BSI image sensor 150 may be similar to the epitaxial layer 104 of the FSI image sensor 100, except the epitaxial layer 156 may have been grinded (thinned) such that light entering from the top of the BSI image sensor 150 strikes a light receiving surface without passing through the metal-interconnect layer 154. Because light does not pass through the wiring in the BSI image sensor 150, light is not scattered or obstructed to the same degree as observed in the FSI image sensor 100. Further, due to the position of the photodetectors 162a and 162b above the metal-interconnect layer 154, the BSI image sensor 150 may not require light pipes to channel the light deeper into the BSI image sensor 150, in contrast to the FSI image sensor 100 as described above. Thus, the BSI image sensor 150 may generally experience better performance when detecting visible light than FSI image sensors. However, as noted above, the thin configuration that enables the BSI image sensor 150 to capture visible light effectively also results in impairment in the ability of the BSI image sensor 150 to capture NIR or IR light as well as the FSI image sensor 100. Specifically, because the epitaxial layer 156 of the BSI image sensor 150 is thinner than the epitaxial layer 104 of the FSI image sensor 100, the BSI image sensor 150 is not able to detect NIR or IR light as well as the FSI image sensor 100 due to the relatively longer wavelengths of NIR/IR light.

Figure 2:
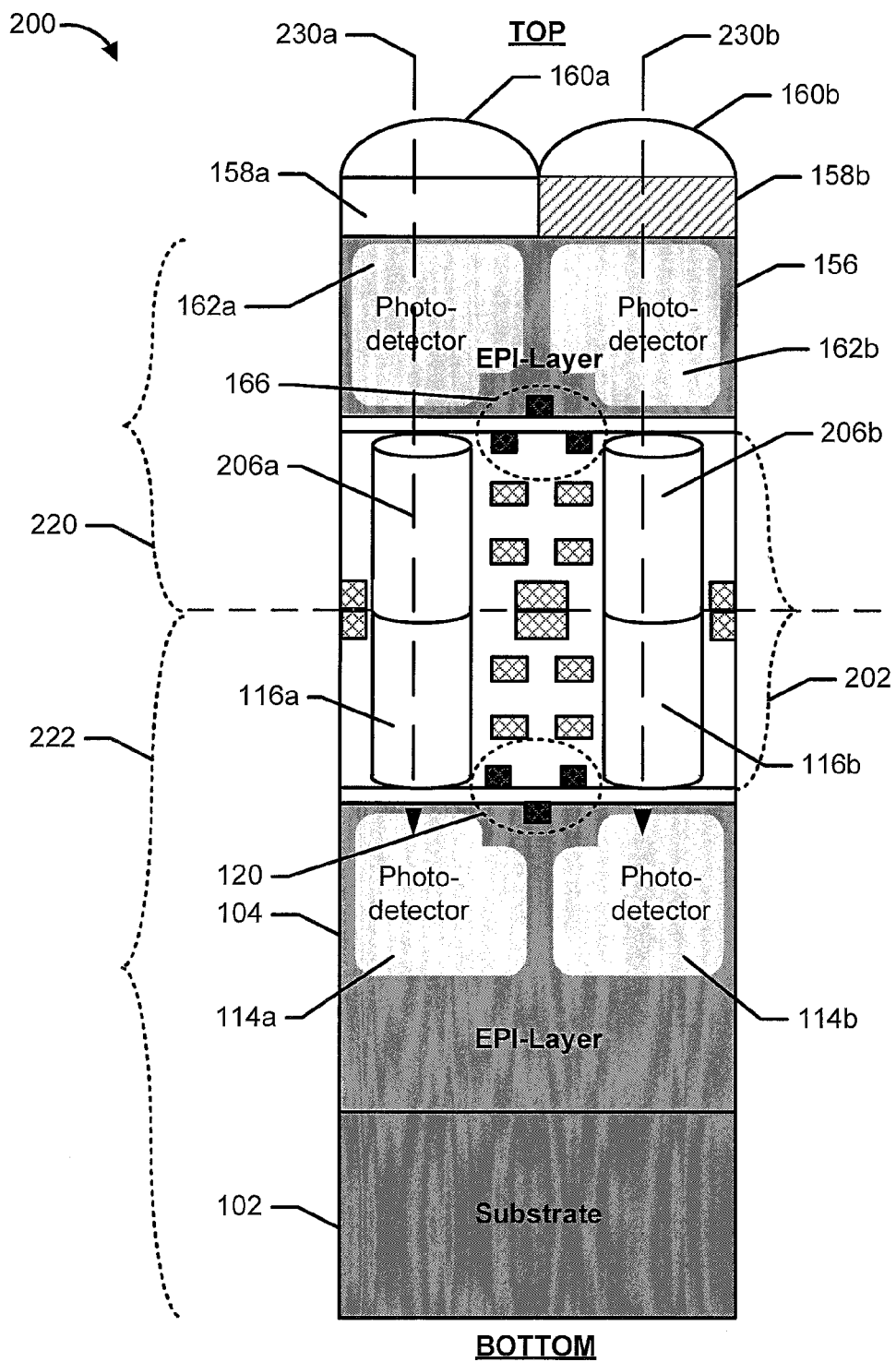
FIG. 2 is a component block diagram showing a cross-section view of an image sensor, according to some embodiments.

Various embodiments described herein are directed to an image sensor that improves on the capabilities of conventional BSI and FSI image sensors by achieving superior visible-light detection abilities of a BSI image sensor and, at the same time, the relatively superior NIR/IR light detection abilities of an FSI image sensor. In particular, the image sensor may include certain features similar to a BSI image sensor and a FSI image sensor (or two FSI image sensors), as well as additional features, in a single image sensor, FIG. 2 illustrates a side view of a cross-section of an example image sensor 200. Generally described, the image sensor 200 may represent a combination of some aspects of a BSI image sensor and an FSI image sensor, whereby components corresponding to a BSI image sensor (e.g., a BSI portion 220) are positioned on top of components corresponding to a FSI image sensor (e.g., an FSI portion 222). Thus, for ease of reference, the image sensor 200 may be described with reference to or as including some components discussed with reference to the FSI image sensor 100 and the BSI image sensor 150, according to some embodiments.

The image sensor 200 may include the micro-lenses 160a and 160b and the color filters 158a and 158b. As described (e.g., with reference to FIG. 1B), the micro-lenses 160a and 160b may focus light 230a and 230b entering the top of the image sensor 200, and the color filters 158a and 158b may selectively filter out certain colors of light. The BSI portion 220 of the image sensor 200 may include the epitaxial layer 156, which may have been grinded or thinned to a thickness that is suitable for receiving visible light. For example, the epitaxial layer 156 may have a thickness of approximately three to five micrometers. The epitaxial layer 156 may include the photodetectors 162a and 162b, which may be configured to receive the light 230a and 230b that has passed through the micro-lenses 160a and 160b and the color filters 158a and 158b. As discussed (e.g., with reference to FIG. 1B), the photodetectors 162a and 162b may be included or embedded in the epitaxial layer 156, and the epitaxial layer 156 may be in electrical contact with a combined metal-interconnect layer 202 via the MOSFET 166.

In some embodiments, the combined metal-interconnect layer 202 of the image sensor 200 may be fabricated by affixing or bonding the bottom of a metal-interconnect layer of a BSI image sensor to the top of a metal-interconnect layer of an FSI image sensor. For example, the bottom of the metal-interconnect layer 154 of the BSI image sensor 150 (FIG. 1B) may be physically joined or coupled to the top of the metal-interconnect layer 108 of the FSI image sensor (FIG. 1A) to form the combined metal-interconnect layer 202. However, unlike the metal-interconnect layer 154 of the BSI image sensor 150 (e.g., as described with reference to FIG. 1B), the combined metal-interconnect layer 202 may include embedded light pipes 206a and 206b to enable the light 230a and 230b—particularly IR or NIR light—to pass through the BSI portion 220 of the combined metal-interconnect layer 202 and to continue traveling into the FSI portion 222 of the image sensor 200.

In some embodiments, the FSI portion 222 of the image sensor 200 may include a bottom portion of the combined metal-interconnect layer 202, which may correspond to a metal-interconnect layer of an FSI image sensor (e.g., the metal-interconnect layer 108 as described with reference to FIG. 1). As such, the bottom portion of the combined metal-interconnect layer 202 may include the light pipes 116a and 116b, which may allow the light 230a and 230b to pass through the light pipes 206a and 206b in the top portion of the combined metal-interconnect layer 202 and to continue on through the bottom portion of the combined metal-interconnect layer 202. The light 230a and 230b may then strike the photodetectors 114a and 114b that are included or embedded in the epitaxial layer 104. Further, the epitaxial layer 104 may be formed from or coupled to the substrate layer 102, as described (e.g., with reference to FIG. 1A).

As described above, the BSI portion 220 of the image sensor 200 may be characterized as having two sensor elements corresponding with at least the two photodetectors 162a and 162b. Similarly, the FSI portion 222 of the image sensor 200 may also be characterized as having two sensor elements corresponding with at least the two photodetectors 114a and 114b. In some embodiments, the sensor elements of the BSI portion 220 and corresponding sensor elements of the FSI portion 222 may be aligned. In particular, in such embodiments, the photodetectors 114a, 114b, 162a, and 162b and the light pipes 116a, 116b, 206a, and 206b of the BSI portion 220 and the FSI portion 222 may be aligned to allow the light 230a and 230b to pass through both portions 220 and 222. For example, the photodetector 162a of the BSI portion 220 may be aligned with the photodetector 114a of the FSI portion 222, and the light pipe 206a of the BSI portion 220 may also be aligned with the light pipe 116a of the FSI portion in order to enable light 230a to be captured by both photodetectors 114a and 162a.

Figure 3:
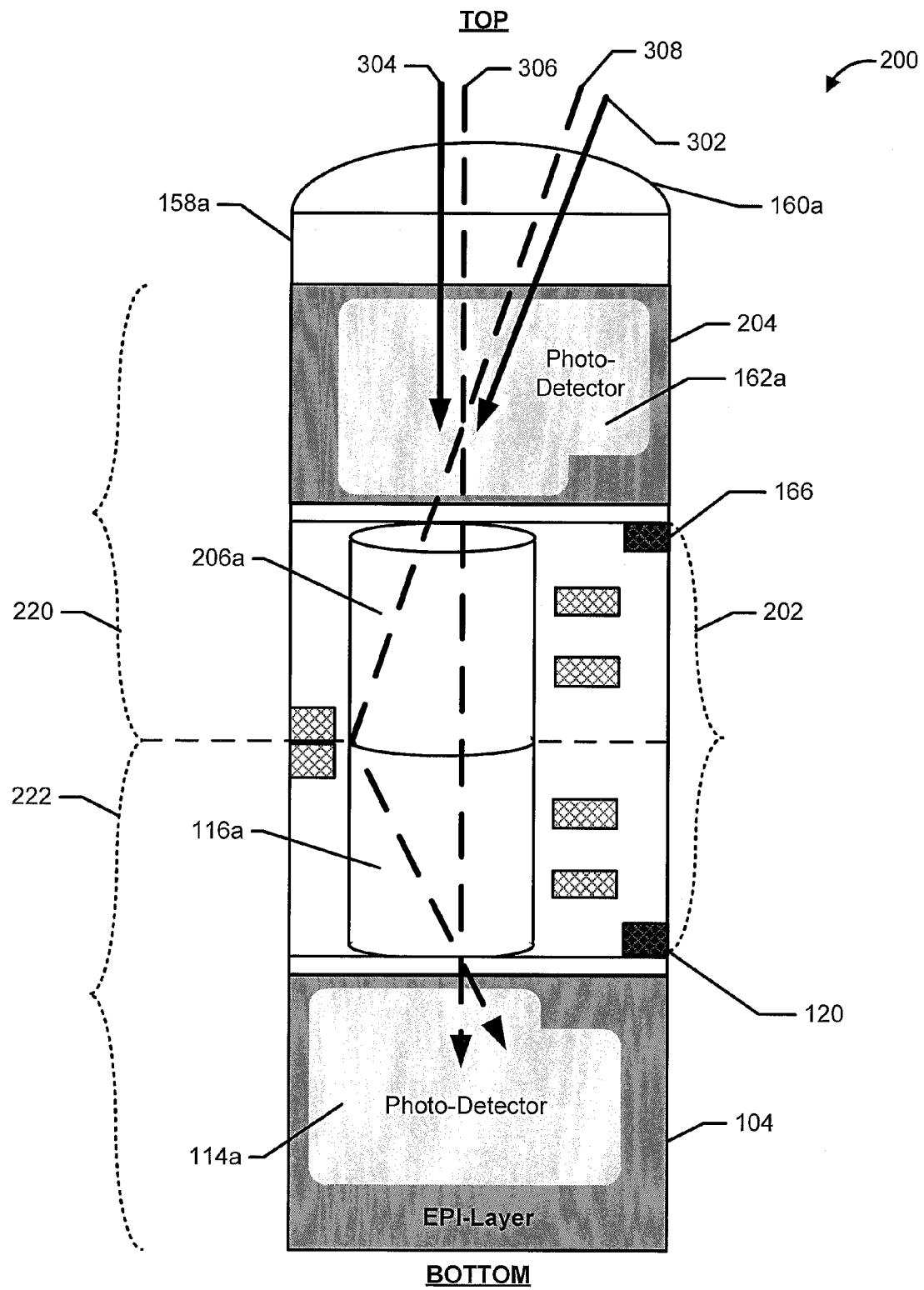
FIG. 3 is a component block diagram showing another cross-section view of an image sensor that includes certain features of a front-illuminated sensor and certain features of a backside-illuminated sensor, as well as additional features, according to some embodiments.

FIG. 3 illustrates a blown-up, cross-sectional view of the image sensor 200 described with reference to FIG. 2. Particularly, the illustrated portion of the image sensor 200 may focus on a single sensor element of the image sensor 200 illustrated in FIG. 2. In some embodiments, the image sensor 200 may be configured to leverage the presence of photodetectors in the BSI portion 220, as well as photodetectors in the FSI portion 222, to effectively capture both visible light and IR/NIR light.

In the example illustrated in FIG. 3, both IR/NIR light 306 and 308 and visible light 302 and 304 may enter from the top of the image sensor 200 and may pass through the microlens 160a and the color filter 158a (e.g., as described with reference to FIG. 2). Due to the shorter wave length of the visible light 302 and 304, the epitaxial layer 156 of the image sensor 200 is ground down to a thickness (e.g., three to five micrometers in thickness) to facilitate the capture of the visible light 302 and 304 by the photo detector 162a. As such, the photodetector 162a may convert the visible light 302 and 304 into an electrical signal that is sent to the combined metal-interconnect layer 202. The electrical signal may pass through the combined metal-interconnect layer 202 to processing resources (not shown) that may convert the electrical signal into a digital signal. This digital signal may be combined with other digital signals, such as from other sensor elements in the image sensor 200, to form a digital image.

However, because the wavelengths of the IR/NIR light 306 and 308 are longer than the visible light 302 and 304, the IR/NIR light 306 and 308 may pass through the photodetector 162a without being detected by the photodetector 162a. Instead, the IR/NIR light 306 and 308 may continue traveling through the light pipes 206a and 116a embedded in the combined metal-interconnect layer 202. In some embodiments, the light pipes 206a and 116a may be configured to control the directionality of the IR/NIR light 306 and 308 in order to reduce signal cross talk between sensor elements.

After passing through the light pipes 206a and 116a, the IR/NIR light 306 and 308 may strike the photodetector 114a in the FSI portion 222 of the image sensor 200. In some embodiments, the thickness of the photodetector 114a may be configured to be thick enough to ensure that the IR/NIR light 306 and 308 will be captured/detected. For example, the epitaxial layer 104 may be configured to have a thickness of eight to twenty micrometers. Further, while the photodetector 116a is described as capturing the IR/NIR light 306 and 308, in some embodiments, the photodetector 116a may also capture visible light that has passed through the photodetector 162a. The photodetectors 114a-b may capture and convert at least a portion of the IR/NIR light 306 and 308 into an electrical signal, which is sent through the MOSFET 120 into the combined metal-interconnect layer 202 and driven to processing resources (now shown). These processing resources may convert the electrical signal into a digital signal that may be combined with other digital signals from other image sensors to create a digital image.

In some embodiments, the signals generated from the photodetector 162a and the photodetector 114a may be combined to increase the quality of the digital signal that is ultimately generated from these signals. In particular, because the photodetector 162a may be configured to be particularly sensitive to the visible light 302 and 304, and because the photodetector 114a may be positioned within the image sensor 200 to effectively sense the IR/NIR light 306 and 308, signals representing both visible and NIR/IR light from these photodetectors 114a and 162a may be combined and converted into a digital image. This digital image may reflect a better representation of both visible light information (e.g., day vision) and NIR/IR light information (e.g., night vision) than digital images generated using only one image sensor. Also, because both of the photodetectors 162a and 114a are detecting light from the same source, the image sensor 200 may effectively be able to capture twice the amount of light as a conventional image sensor. As a result, the image sensor 200 may generate more information using smaller photodetectors.

Further, in addition to reducing signal cross talk between photodetectors, the light pipes 206a and 116a may be configured to keep the corresponding photodetectors in the FSI and BSI portions 220 and 222 of the image sensor 200 aligned. In particular, the light pipes 206a and 116a may be configured to enable light that has passed through the photodetector 162a to reach the photodetector 114a. As a result, the resulting electrical signal that photodetectors 114a and 162a generate may correspond to light received from the same source, which may improve the overall quality of digital images generated from these electrical signals.

FIGS. 4A-4F are component diagrams illustrating a process 400 for fabricating an image sensor (e.g., the image sensor 200 described with reference to FIGS. 2 and 3), according to some embodiments. In such embodiments, the image sensor may be assembled at least in part by configuring and combining a first sensor portion and a second sensor portion.

Figure 4A:
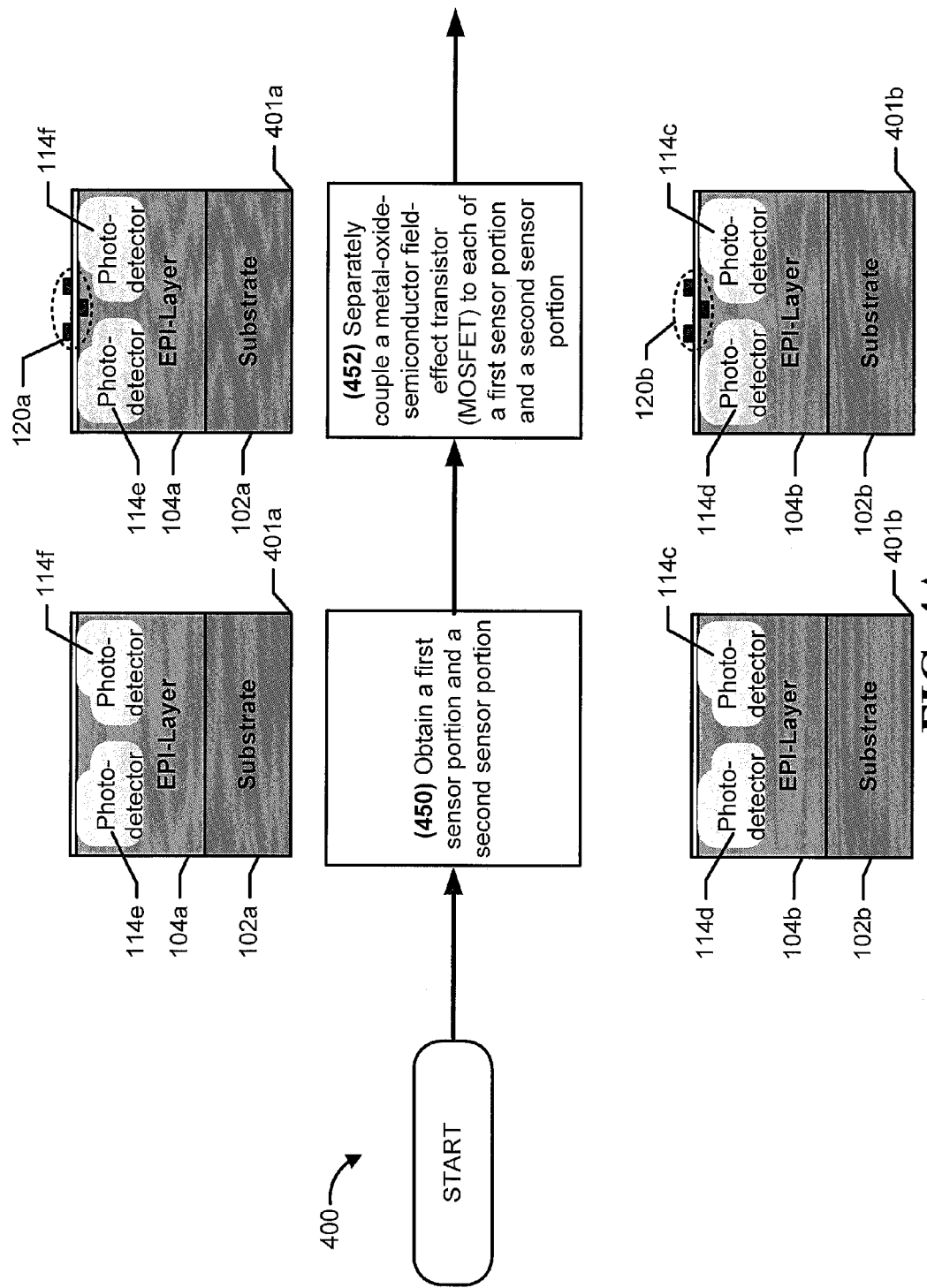
FIGS. 4A-4F are component block diagrams illustrating an example method of assembling an image sensor, according to some embodiments.

With reference to FIG. 4A, a first sensor portion 401*a* and a second sensor portion 401*b* may be obtained in block 450. In some embodiments, each of the image sensors portions 401*a* and 401*b* may include a substrate layer coupled to an epitaxial layer having one or more photodetectors. In the example illustrated in FIG. 4A, the first sensor portion 401*a* may include a substrate layer 102*a* and the epitaxial layer 104*a* that includes the photodetectors 114*e* and 114*f*. Similarly, the second sensor portion 401*b* may include a substrate layer 102*b* and an epitaxial layer 104*b* that includes photodetectors 114*c* and 114*d*. The substrate layers 102*a* and 102*b* may correspond to or may have similar structure and capabilities as the substrate layer 102 (e.g., as described with reference to FIG. 1A). Similarly, the epitaxial layers 104*a* and 104*b* may correspond to the epitaxial layer 104, as described above. Further, the photodetectors 114*c-f* may also correspond to the photodetectors 114*a* and 114*b* (e.g., as described with reference to FIG. 1A). In some embodiments, each of the first and second sensor portions 401*a* and 401*b* may be suitable for use as an FSI image sensor. Alternatively, one or both of the first and second sensor portions 401*a* and 401*b* may be configured for use as a BSI image sensor.

In block 452, a MOSFET 120*a* may be coupled to the first sensor portion 401*a*, and a MOSFET 120*b* may be coupled to the second sensor portion 401*b*. In some embodiments, the operations of coupling an image sensor wafer with a MOSFET, as performed in block 452, may include depositing a layer of silicon (e.g., metal silicon or polycrystalline silicon) on top of the epitaxial layer.

Figure 4B:
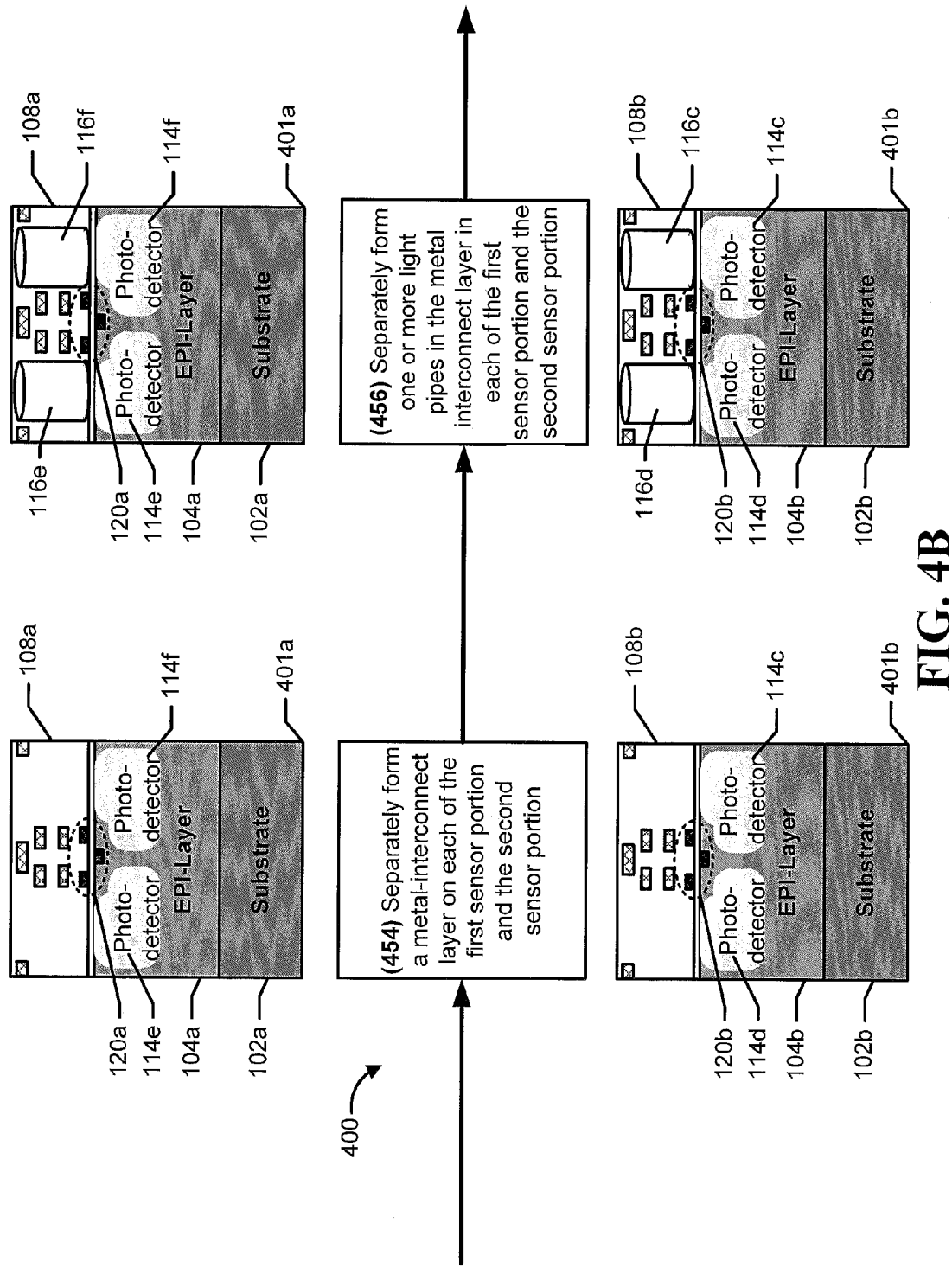

Continuing with the description of the process 400 in FIG. 4B, a metal-interconnect layer 108*a* and a metal-interconnect layer 108*b* may be respectively formed on the first sensor portion 401*a* and the second sensor portion 401*b*, in block 454. In some embodiments, each of the metal-interconnect layers 108*a* and 108*b* may be in electrical contact with the MOSFETs 120*a* and 120*b* on each respective image sensor wafer. In some embodiments, the MOSFETs 120*a* and 120*b* may correspond to or fulfill functions similar to those functions described with reference to the MOSTFET 120 (e.g., as described with reference to FIG. 1A). Similarly, the metal-interconnect layers 108*a* and 108*b* may be configured similarly to the metal-interconnect layer 108 (e.g., as described with reference to FIG. 1A). As such, the MOSFETs 120*a* and 120*b*, respectively, may be coupled to the epitaxial layers 104*a* and 104*b* and may be configured to transfer electrical signals generated by the photodetectors 114*c-f* to the metal-interconnect layers 108*a* and 108*b*. Further, the metal-interconnect layers 108*a* and 108*b* may be configured to drive these electrical signals to processing components in electrical contact with the metal-interconnect layers 108*a* and 108*b* (not shown)—e.g., a central processing unit or digital signal processor on an image processing device—where those electrical signals are converted into a digital signals and ultimately combined with other digital signals to generate a digital image.

In block 456, light pipes 116*e* and 116*f* may be formed in the metal-interconnect layer 108*a* of the first sensor portion 401*a*, and light pipes 116*c* and 116*d* may be formed in the metal-interconnect layer 108*b* of the second sensor portion 401*b*. As discussed (e.g., with reference to the light pipes 116*a* and 116*b* of FIGS. 1A and 2), the light pipes 116*e-f* and 116*c-d* may be configured to guide light through the metal-interconnect layers 108*a* and 108*b*, respectively, thereby reducing the likelihood that the light will be obstructed or scattered by wires or metal components within the metal-interconnect layers 108*a* and 108*b*. As further described herein, the light pipes 116*e-f* and 116*c-d* formed in each of the first and second sensor portions 401*a* and 401*b* may be configured to enable light (e.g., NIR or IR light) to pass through the photodetectors 114*c-d* within the second sensor portion 401*b*, through the metal-interconnect layers 108*a* and 108*b*, and into the photodetectors 114*e-f* included in the first sensor portion 401*a*.

Figure 4C:
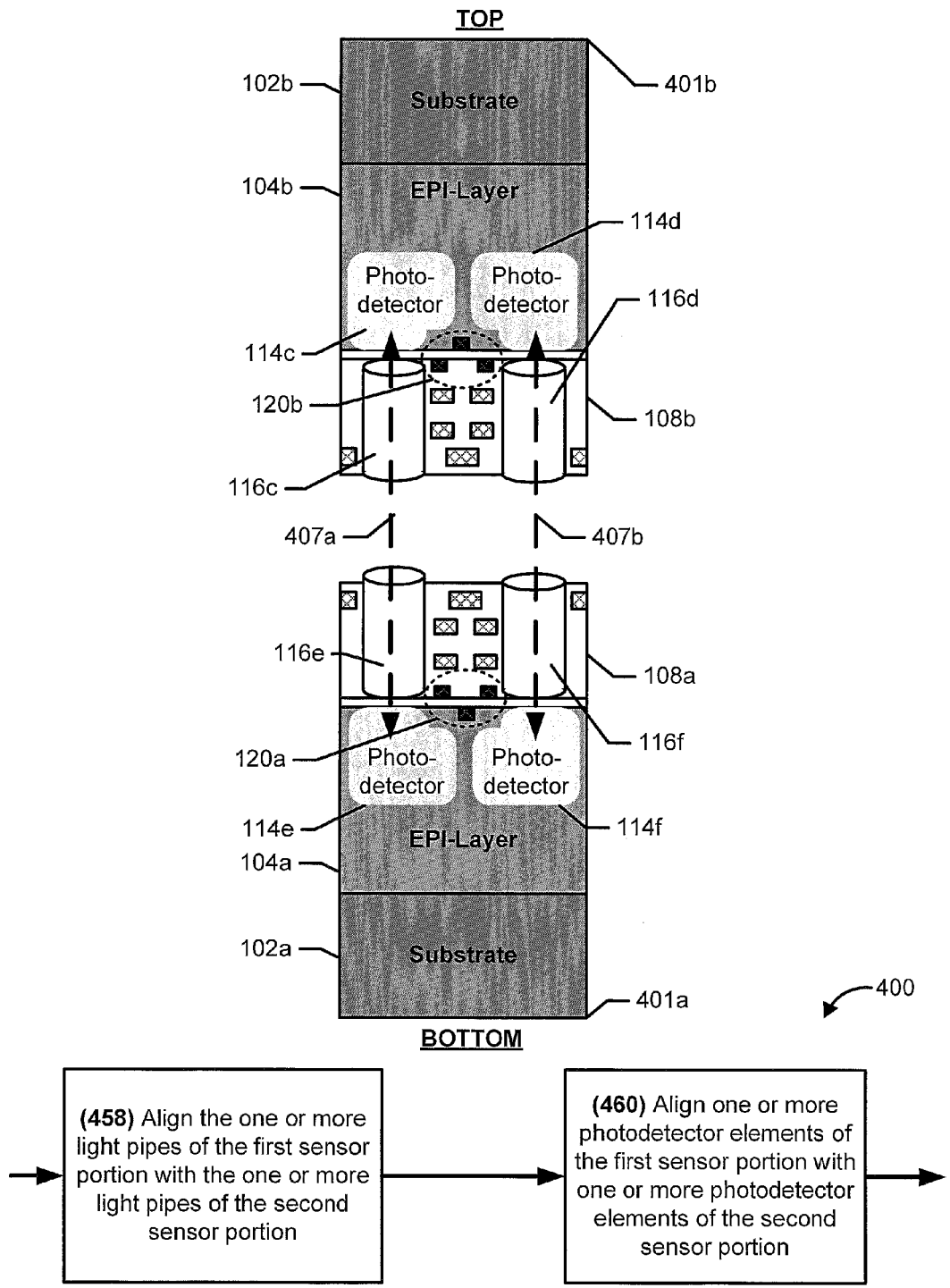

In some embodiments, by configuring the first sensor portion 401*a* and the second sensor portion 401*b* via the operations performed in blocks 450-456, the first sensor portion 401*a* and the second sensor portion 401*b* may individually be ready to combine into a single, combined sensor image, as further described with reference to the process 400 as illustrated in FIG. 4C. The first sensor portion 401*a* and the second sensor portion 401*b* may be positioned relative to one another in preparation of coupling the image sensors portions 401*a* and 401*b* together. Specifically, in block 458, the first sensor portion 401*a* and the second sensor portion 401*b* may be positioned relative to one another such that the light pipes 116*e-f* of the first sensor portion 401*a* are aligned with the light pipes 116*c-d* of the second sensor portion 401*b*. In the example illustrated in FIG. 4C, the light pipes 116*c* and 116*e* may be aligned or oriented about an axis 407*a*, and the light pipes 116*d* and 116*f* may be similarly aligned or oriented about an axis 407*b*. The light pipes 116*c-f* may be aligned in such a way as to enable light to pass from the second sensor portion 501*b*, through the metal-interconnect layers 108*a* and 108*b* via the aligned light pipes 116*c-f*, and finally to the first sensor portion 401*a*. Thus, in some embodiments in which the light pipes are cylindrical, the light pipe 116*c* may have the same or a substantially similar diameter to the diameter of the light pipe 116*e*, and the light pipe 116*d* may have the same or a substantially similar diameter to the diameter of the light pipe 116*f*.

In block 460, the photodetectors 114*c-d* of the second sensor portion 401*b* may be aligned with the photodetectors 114*e-f*. For example, the photodetector 114*e* of the second sensor portion 401*b* may be aligned with the photodetector 114*c* of the first sensor portion 401*a*, with reference to the axis 407*a*. Similarly, the photodetector 114*d* of the second sensor portion 401*b* may be aligned with the photodetector 114*f* of the first sensor portion 401*a* (e.g., with respect to the axis 407*b*). In some embodiments, the operations for aligning the photodetectors 114*c-f* may be accomplished at the same time that the light pipes 116*c-f* are aligned, as described with reference to the operations of block 458.

Figure 4D:
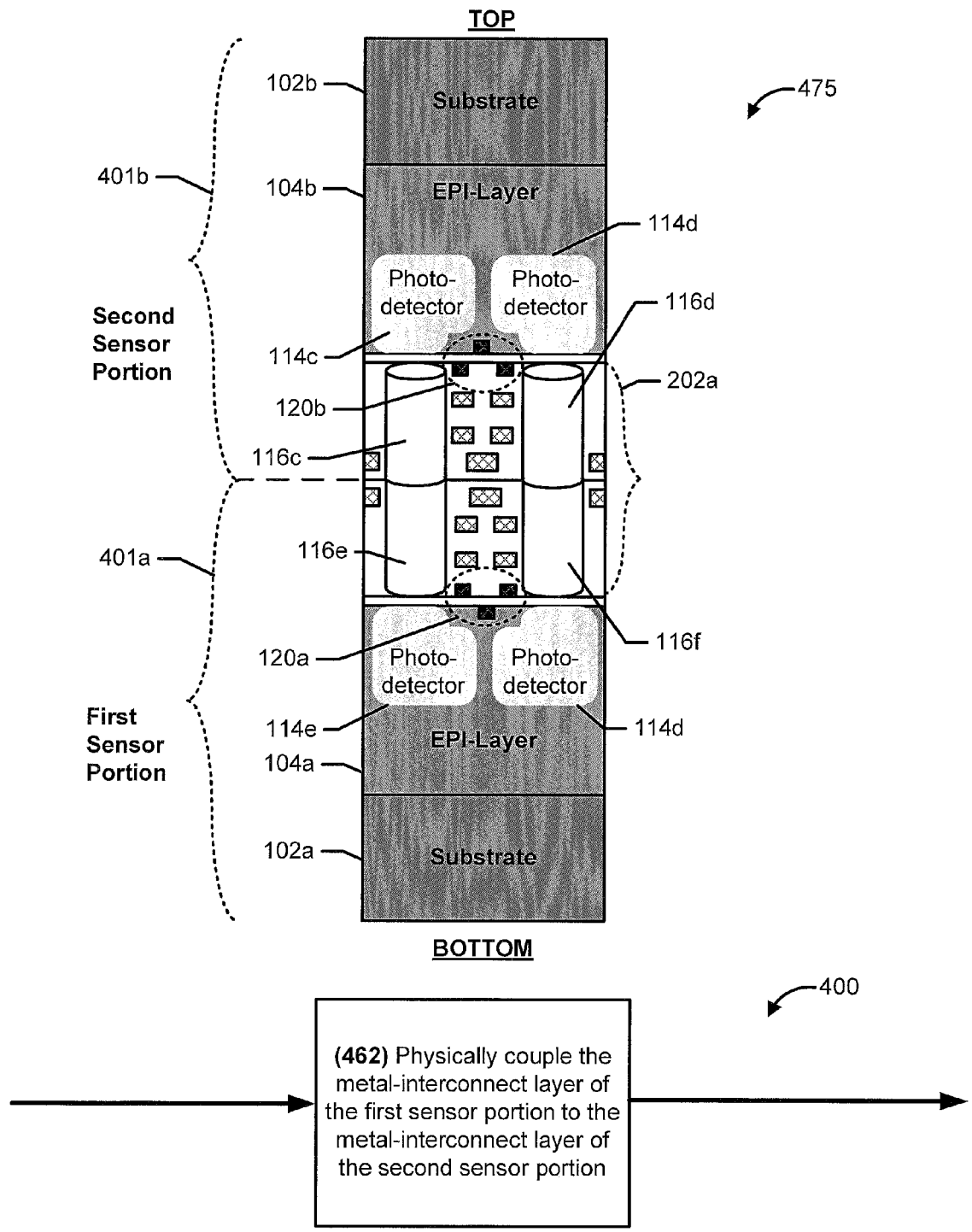
Figure 4E:
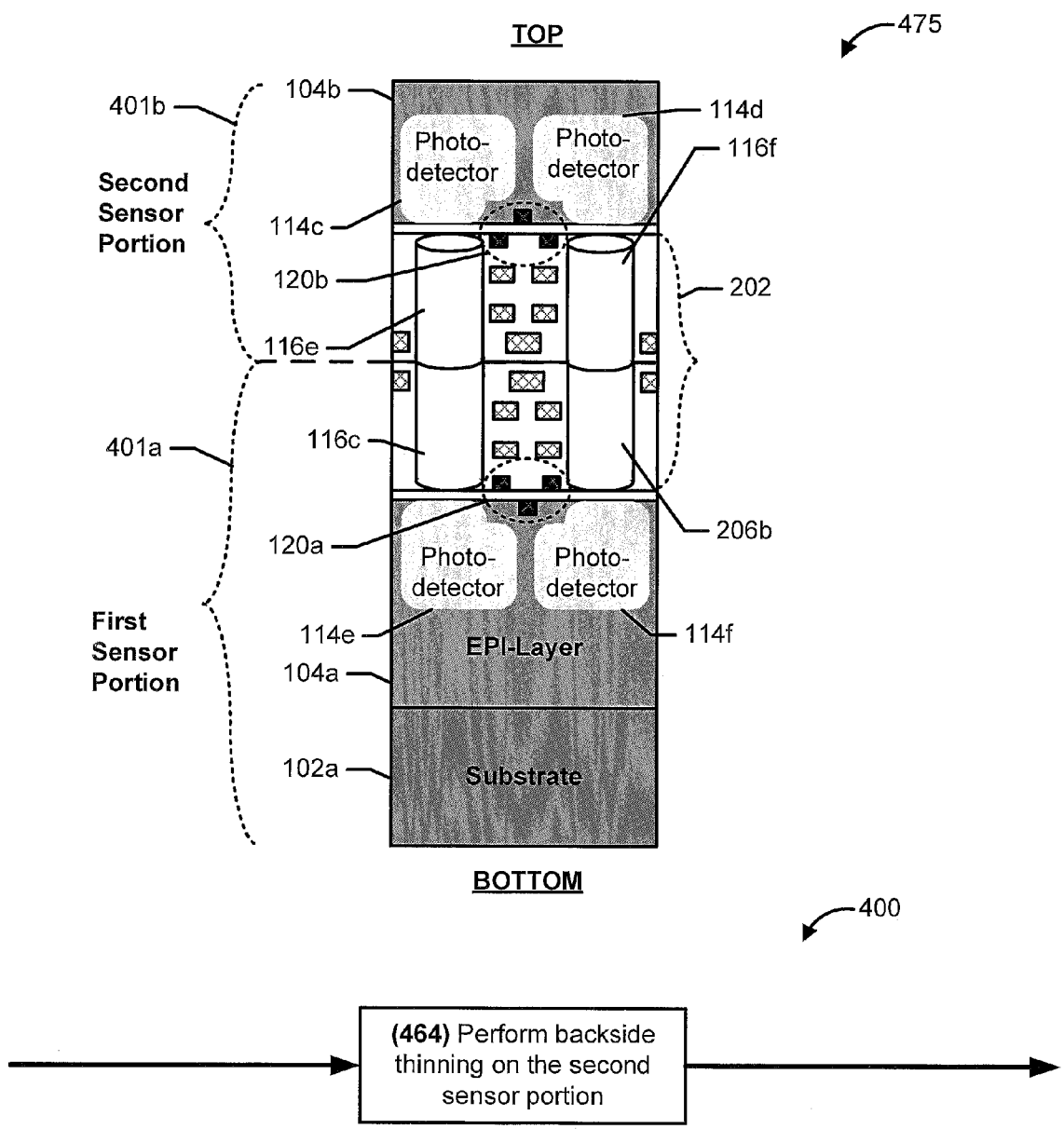

Turning to FIG. 4D, once the first sensor portion 401*a* and the second sensor portion 401*b* are aligned, the image sensors portions 401*a* and 401*b* may be combined to form an image sensor 475. Particularly, in block 462, the metal-interconnect layer 108*a* of the first sensor portion 401*a* may be physically coupled to the metal-interconnect layer 108*b* of the second sensor portion 401*b* to form a combined metal-interconnect layer 202*a*, which may correspond to the combined metal-interconnect layer 202 described above (e.g., with reference to FIG. 2). The metal-interconnect layer 108*a* may be bonded to the metal-interconnect layer 108*b* such that the light pipes 118*c-f* and photodetectors 116*c-f* are aligned (e.g., as described with reference to FIG. 4C). Further, in some embodiments, the metal-interconnect layers 108*a-b* may be physically coupled together such that the metal-interconnect layers 108*a-b* are in electrical contact. In such embodiments, the combined metal-interconnect layer 202a may function as driving circuitry for driving electrical signals received from both the photodetectors 114c-d, as well as the photodetectors 114e-f. In some embodiments, coupling the metal-interconnect layers 108a and 108b may cause the light pipes 116c and 116e and the light pipes 116d and 116f to touch physically. As such, in embodiments in which the light pipes c-f are made of hollow material having reflective linings, coupling the metal-interconnect layers 108a and 108b may cause the light pipes 116c and 116e and the light pipes 116d and 116f to form respective cavities (e.g., with respect to common axes 407a and 407b). In some embodiments in which the light pipes 116c-f are made of transparent and solid materials, coupling the metal-interconnect layers 108a and 108b may not cause the light pipes 116c-f to form cavities.

Once the metal-interconnect layers 108a and 108b are physically coupled together, the first and second sensor portions 401a and 401b may form the core components of the image sensor 475. However, in order to be able to receive and detect light, the image sensor 475 may be further configured as discussed with reference to FIG. 4E. In particular, in block 464, the thickness of the second sensor portion 401b, as part of the image sensor 475, may be reduced by performing backside thinning or grinding. In particular, the substrate layer 102b may be removed and the epitaxial layer 104b may be thinned (e.g., to a thickness of approximately three to five micrometers).

As a result of reducing the thickness of the second sensor portion 401b portion of the image sensor 475, the second sensor portion 401b may be able to receive and detect light in a manner similar to the manner in which a BSI image sensor detects light (e.g., as described with reference to the BSI image sensor 150 of FIG. 1B). For example (e.g., as described with reference to FIG. 2), light (not shown) may enter the second sensor portion 401b from the top of the image sensor 475. The light may be received/detected by the photodetectors 114c-114d before at least a portion of the light (e.g., NIR or IR light) passes through the combined metal-interconnect layer 202a to be received/detected by the photodetectors 114e-f of the first sensor portion 401a of the image sensor 475. As such, the first sensor portion 401a may be configured to function within the image sensor 475 in a manner similar to an FSI image sensor. In some embodiments of the operations performed in block 464, the thickness of the second sensor portion 401b may be reduced to approximately three micrometers.

Figure 4F:
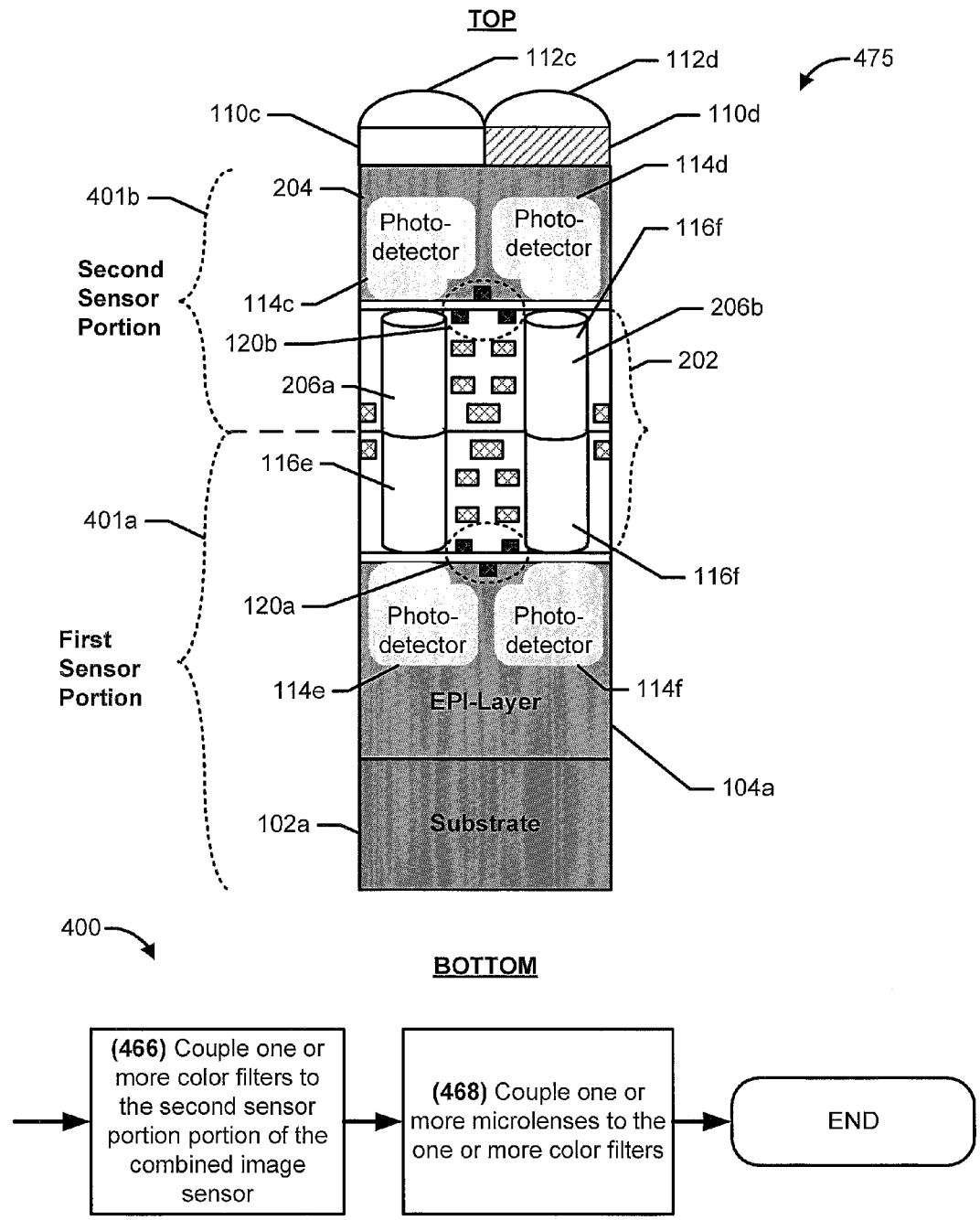

Turning to FIG. 4F, the image sensor 475 may be further configured by coupling one or more color filters to the second sensor portion 401b. Specifically, in the example illustrated in FIG. 4F, color filters 110c and 110d may be coupled to the top of the second sensor portion 401b. In some embodiments, the color filters 110c and 110d may correspond with or may functional similarly to the color filters 110a and 110b (e.g., described with reference to FIG. 1A). As such, the color filters 110c and 110d may filter out or prevent certain wavelengths of light from passing through the image sensor 475. Further, in block 468, micro-lenses 112c and 112d may be coupled to the one or more color filters 110c and 110d coupled to the second sensor portion 401b in block 466, and the process 400 may end. In some embodiments, the micro-lenses 112c and 112d may focus light that enters from the top of the image sensor 475 (e.g., as described with reference to the micro-lenses 112a and 112b of FIG. 1A).

Figure 5:
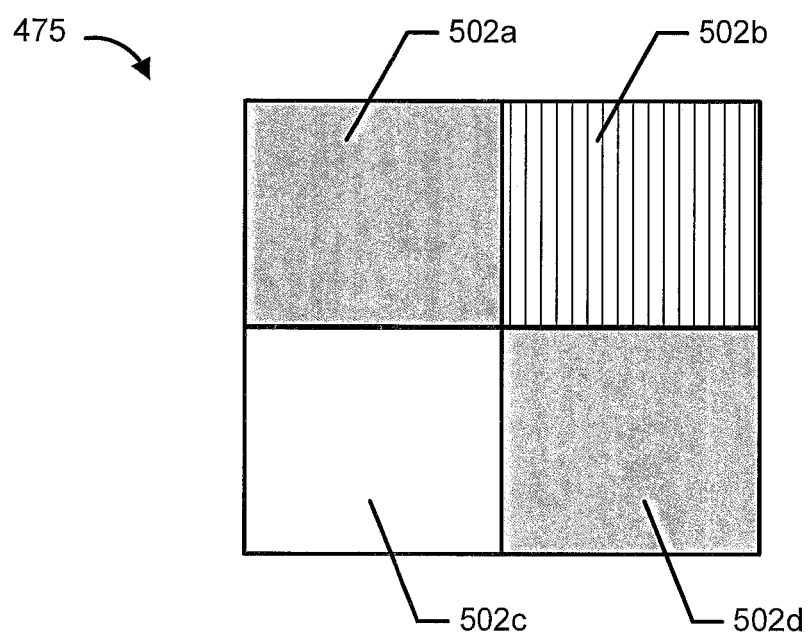
FIG. 5 is a component block diagram showing a top view of the image sensor, according to some embodiments.

FIG. 5 illustrates a top view of the image sensor 475, according to some embodiments. In particular, the image sensor 475 may be arranged as a 2×2 array of sensor elements 502a, 502b, 502c, and 502d. In some embodiments, the array of sensor elements 502a-d may correspond with one of various color filter arrays or color filter mosaics formed by selectively placing certain color filters on each of the cells in the array. For example, the array of sensor elements 502a-502d may correspond to a Bayer filter in which the sensor elements 502a and 502d include a color filter that selectively allows only light in the green spectrum to pass through, the sensor cell 502b may selectively allow only light in the red, NIR, or IR spectrum to pass through, and the sensor cell 502c may selectively allow only light in the blue spectrum to pass through. Alternatively, the sensor elements 502a, 502b, 502c, and 502d may be configured with a different color filter array, such as a cyan-yellow-yellow-magenta (CYYM) filter. Further, as described above, each of the sensor elements 502a-502d of the image sensor 475 may correspond with at least one photodetector included in the second sensor portion 401b and a corresponding photodetector included in the first sensor portion 401a.

While the image sensor 475 is illustrated in FIG. 5 as having a 2×2 array of sensor elements 502a-502d, the image sensor 475 may be configured with an arbitrary number of one or more sensor elements arranged in a two-dimensional array of sensor elements. For example, the image sensor 475 may include a 1×1, 640×480, or 4000×3000 matrix of sensor elements.

Figure 6A:
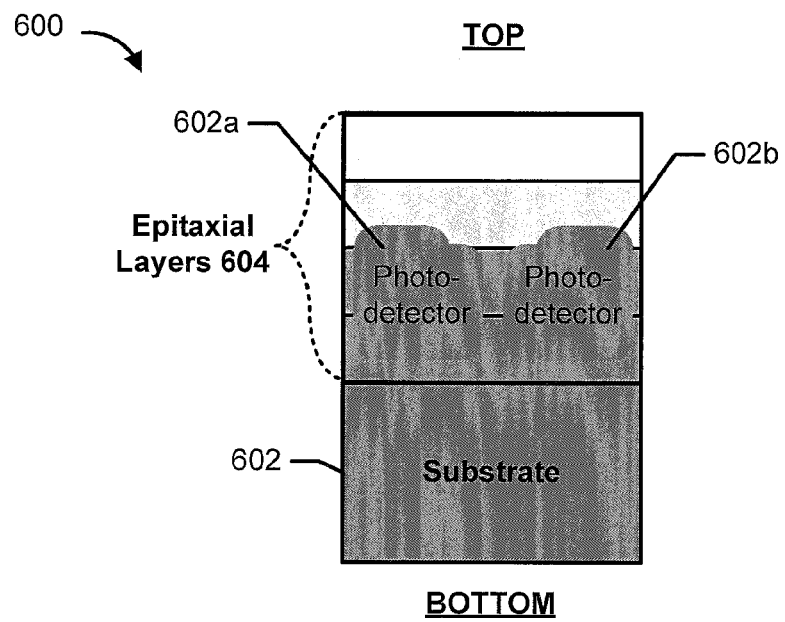
FIGS. 6A and 6B are component block diagrams illustrating alternative wafers for use in assembling an image sensor, according to some embodiments.
Figure 6B:
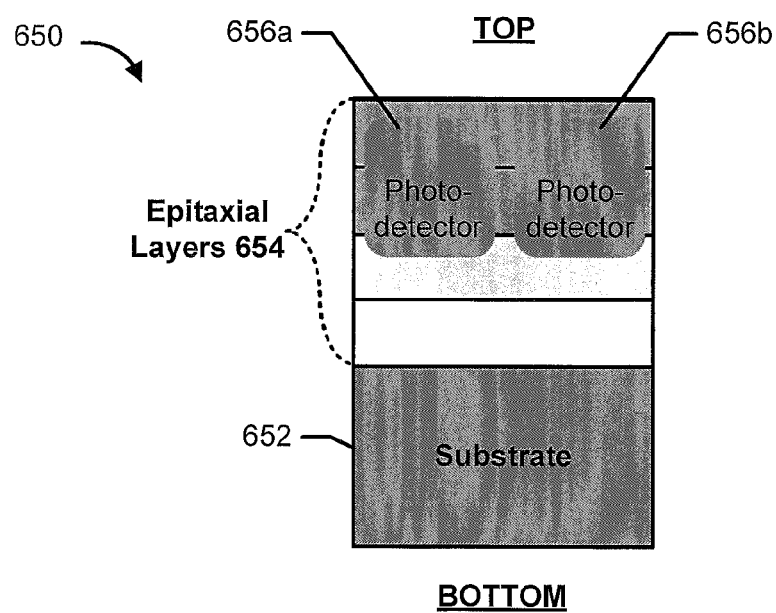

FIGS. 6A and 6B illustrate cross-sectional side-views of first sensor portion 600 and a second sensor portion 650 with alternative configurations, according to some embodiments. In particular, the alternative configurations of the first sensor portion 600 and the second sensor portion 650 may correspond to use of multiple epitaxial layers to extend the sensitivity of the photodetectors in those image sensors to NIR and IR light.

With reference to FIG. 6A, the alternative first sensor portion 600 may include a substrate layer 602 (e.g., similar to the substrate layer 102 as described with reference to FIG. 1A). The alternative first sensor portion 600 may further include multiple graded epitaxial layers 604 grown from the substrate layer 602, with each layer of the multiple graded epitaxial layers 604 having a different doping concentration. In particular, layers of the multiple graded epitaxial layers 604 closer to the top of the alternative first sensor portion 600 may have a lower doping concentration than layers closer to the bottom of the alternative first sensor portion 600. In a non-limiting example, the first sensor portion may be made from a boron-doped, p-type semiconductor material. Accordingly, in this example, a layer of the multiple graded epitaxial layers 604 closest to the top of the alternative first sensor portion 600 may have a boron-doping concentration of approximately $2*10^{14}/cm^3$. In contrast, a layer of the multiple graded epitaxial layers 604 nearest the bottom of the alternative first sensor portion 600 may have a relatively higher boron-doping concentration of approximately $2*10^{16}/cm^3$.

Differences in the doping concentrations of the multiple graded epitaxial layers 604 may affect the light detecting capabilities of photodetectors included within these layers 604. As such, in some embodiments, the photodetectors 602a and 602b of the alternative first sensor portion 600 may be included within layers having a relatively higher doping concentration because layers with higher doping concentrations may improve the ability of the photodetectors to detect light (e.g., NIR or IR light).

With reference to FIG. 6B, the alternative second sensor portion 650 may also include a substrate layer 652 and multiple graded epitaxial layers 654 grown from the substrate layer 652. As discussed with reference to the multiple graded epitaxial layers 604, each layer of the multiple graded epitaxial layers 654 may have a different doping concentration. In particular, layers of the multiple graded epitaxial layers 654 closer to the top of the alternative second sensor portion 650 may have a higher doping concentration than layers closer to the bottom of the alternative second sensor portion 650. For example, the alternative second sensor portion 650 may be a boron-doped, p-type semiconductor. A layer of the multiple graded epitaxial layers 654 closest to the top of the alternative second sensor portion 650 may have a boron-doping concentration of approximately $2*10^{16}/cm^3$, whereas a layer of the multiple graded epitaxial layers 654 nearest the bottom of the alternative second sensor portion 650 may have a boron-doping concentration of approximately $2*10^{14}/cm^3$.

As discussed above (e.g., with reference to FIG. 6A), differences in the doping concentrations of the multiple graded epitaxial layers 654 may affect the light detecting capabilities of photodetectors included within these layers 604. As a result, the photodetectors 652a and 652b of the alternative second sensor portion 650 may be included within layers of the multiple graded epitaxial layers 654 having a relatively higher doping concentration due to the improved ability of the photodetectors to detect light (e.g., NIR or IR light).

In some embodiments, the alternate first sensor portion 600 and the second sensor portion 650 may be combined to form a combine image sensor, such as by performing the process 400 (e.g., as described above with reference to FIGS. 4A-4F) using the alternative first and second sensor portions 600 and 650 rather than the first and second sensor portions 401a and 401b. In such embodiments, the operations performed in the process 400 described with reference to the first sensor portion 401a may instead be performed on the alternative first sensor portion 600. Similarly, operations performed in the process 400 described with reference to the second sensor portion 401b may be performed on the alternative second sensor portion 650. In such embodiments, the gradation of the multiple graded epitaxial layers 654 may be inverted in relation to the gradation of the multiple graded epitaxial layers 604 because the substrate layer 652 and, potentially, some of the epitaxial layers closer to the bottom of the alternative second sensor portion 650 may be grinded down or removed as part of combining the alternative first and second sensor portions 600 and 650 to combine a combine image sensor (see, e.g., operations performed in block 464 of the process 400 described with reference to FIG. 4E).

Figure 7:
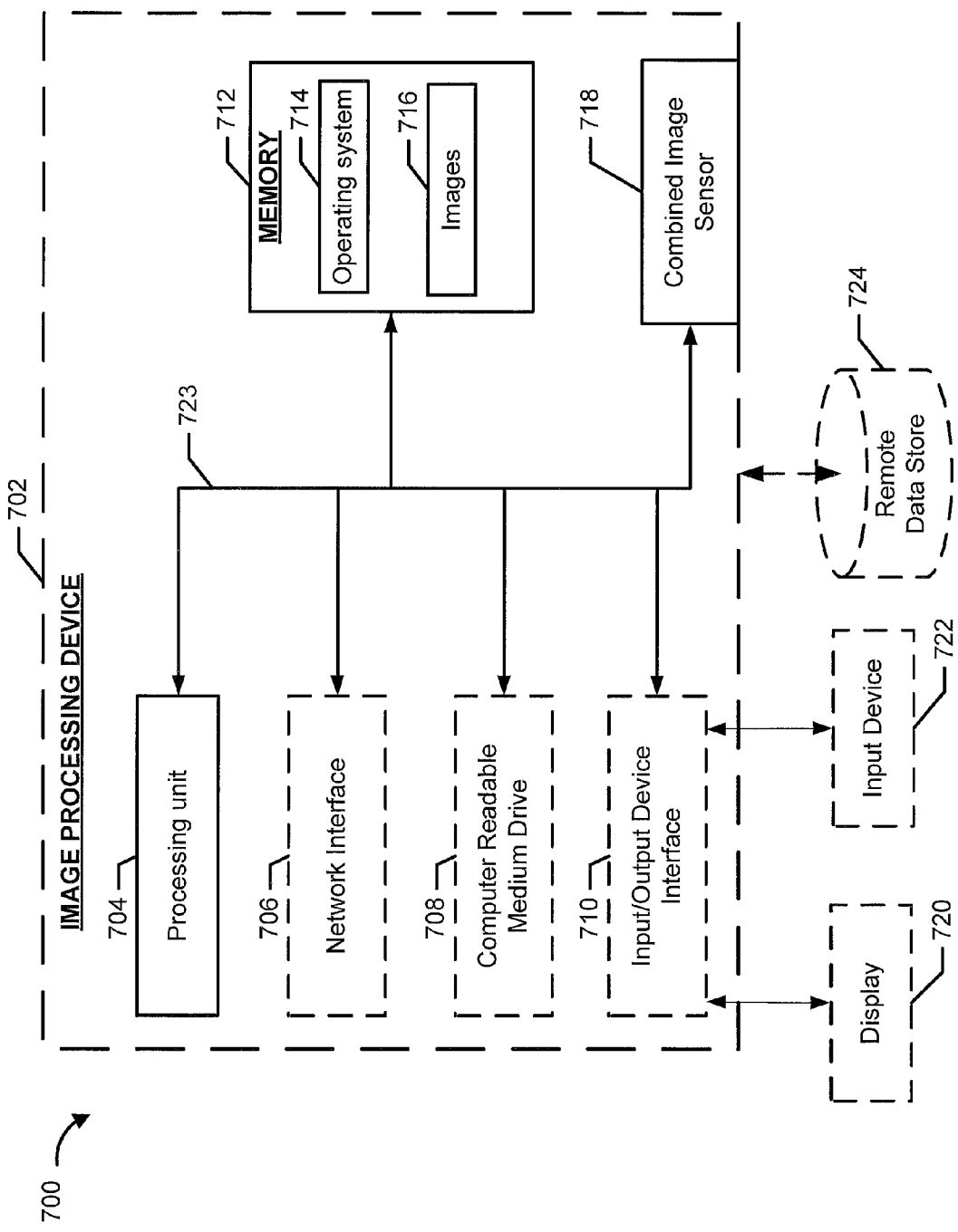
FIG. 7 is a component block diagram illustrating an example of an image processing device suitable for use with some embodiments.

FIG. 7 depicts a general architecture of the image processing device 700 that includes an image sensor 718, according to various embodiments. The general architecture of the image processing device 700 depicted in FIG. 7 includes an arrangement of computer hardware and software components that may be used to implement aspects of the present disclosure. The image processing device 700 may include many more (or fewer) elements than those shown in FIG. 7. It is not necessary, however, that all of these generally conventional elements be shown in order to provide an enabling disclosure.

As illustrated, the image processing device 700 may include a processing unit 704, an optional network interface 706, an optional computer readable medium drive 708, an input/output device interface 710, an optional display 720, and an optional input device 722, all of which may communicate with one another by way of a communication bus 723. The network interface 706 may provide connectivity to one or more networks or computing systems. For example, the processing unit 704 may receive and/or send information and instructions from/to other computing systems or services via one or more networks (not shown). The processing unit 704 may also communicate to and from a memory 712 and may further provide output information for the optional display 720 via the input/output device interface 710. The optional display 720 may be external to the image processing device 700 or, in some embodiments, may be part of the image processing device 700. The display 720 may comprise an LCD, LED, or OLED screen, and may implement touch sensitive technologies. The input/output device interface 710 may also accept input from the optional input device 722, such as a keyboard, mouse, digital pen, microphone, touch screen, gesture recognition system, voice recognition system, or another input device known in the art.

The memory 712 may include computer- or processor-executable instructions (grouped as modules or components in some embodiments) that the processing unit 704 may execute in order to various operations. The memory 712 may generally include random-access memory ("RAM"), read-only memory ("ROM"), and/or other persistent, auxiliary, or non-transitory computer-readable media. The memory 712 may store an operating system 714 that provides computer program instructions for use by the processing unit 704 in the general administration and operation of the image processing device 700. The memory 712 may further include computer program instructions and other information for implementing aspects of the present disclosure. In addition, the memory 712 may communicate with an optional remote data store 724.

In some embodiments, the memory 712 may store or include digital representations of images 716 obtained on the image processing device 700. In some embodiments, the images 716 stored in the memory 712 may include images captured using an image sensor 718 (e.g., the image sensor 202 described with reference to FIG. 2). The image sensor 718 may convert visible, NIR, or IR light into a digital signal, which may be stored as one or more images in the memory 712. The images may be stored in one or more image file formats, such as a bitmap or raster format (e.g., JPEG, GIF, and BMP) or as vector graphic formats (e.g., scalable vector graphics or "SVG" format). In some embodiments, the images 716 may include images received over a network (not shown) via the network interface 706. In such examples, the images 716 may include image files receives from a website, from a network device, or from an optional remote data store 724.

In some embodiments, the processing unit 704 may utilize the input/output device interface 710 to display or output an image on the display 720. For example, the processing unit 704 may cause the input/output device interface 710 to display one of the images 716 for a user of the image processing device 700.

The detailed description is directed to certain specific embodiments of the invention. However, the invention can be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to, or other than one or more of the aspects set forth herein.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, e.g., a combination of a DSP and a microprocessor, a plurality of microprocessors, one or more microprocessors in conjunction with a DSP core, or any other such configuration. Although described herein primarily with respect to digital technology, a processor may also include primarily analog components. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. An image sensor, comprising:
   a lens;
   a first sensor portion; and
   a second sensor portion coupled to the first sensor portion and positioned between the lens and the first sensor portion,
   wherein:
   the first sensor portion comprises:
   a first photodetector;
   a first metal-interconnect layer; and
   a hollow first light pipe, the second sensor portion comprises:
  a second photodetector;
  a second metal-interconnect layer, wherein the second photodetector is positioned between the lens and the second metal-interconnect layer; and
  a hollow second light pipe, the first and second light pipe structured and aligned to form a cavity about a common axis, and
the first metal-interconnect layer is bonded to the second metal-interconnect layer to form a combined metal-interconnect layer, wherein the cavity is formed within the combined metal-interconnect layer between the first photodetector and the second photodetector to allow light to pass from the second photodetector, through the combined metal-interconnect layer, and to the first photodetector.

2. The image sensor of claim 1, wherein a thickness of the first sensor portion is at least seven micrometers.

3. The image sensor of claim 1, wherein a thickness of the second sensor portion is no more than five micrometers.

4. The image sensor of claim 1, wherein the image sensor further comprises a color filter.

5. The image sensor of claim 1, wherein:
the first light pipe is formed within the first metal-interconnect layer; and
the second light pipe is formed within the second metal-interconnect layer.

6. The image sensor of claim 5, wherein the first metal-interconnect layer is bonded to the second metal-interconnect layer such that the first photodetector aligns with the second photodetector about the common axis.

7. The image sensor of claim 6, wherein the first light pipe is aligned with the second light pipe about the common axis.

8. The image sensor of claim 1, wherein the light originates from a common direction.

9. The image sensor of claim 8, wherein the light comprises at least one of near-infrared light or infrared light.

10. The image sensor of claim 1, wherein:
the first sensor image further comprises a first plurality of epitaxial layers;
each epitaxial layer of the first plurality of epitaxial layers has a distinct doping concentration; and
the first plurality of epitaxial layers is arranged within the first sensor portion based on respective doping concentrations of the first plurality of epitaxial layers.

11. The image sensor of claim 10, wherein:
the second sensor portion further comprises a second plurality of epitaxial layers;
each epitaxial layer of the second plurality of epitaxial layers has a distinct doping concentration;
the second plurality of epitaxial layers is arranged within the second sensor portion based on respective doping concentrations of the second plurality of epitaxial layers; and
an arrangement of the second plurality of epitaxial layers within the second sensor portion is inverse of an arrangement of the first plurality of epitaxial layers within the first sensor portion.

12. An image processing device, comprising:
a lens;
an image sensor comprising:
  a first portion of the image sensor comprising:
    a first photodetector, and
    a hollow first light pipe;
  a second portion of the image sensor coupled to the first portion and positioned between the lens and the first sensor portion and comprising:
    a second photodetector aligned with the first photodetector about a common axis, and
    a hollow second light pipe aligned on a common axis with the first light pipe to form a cavity around the common axis with the first light pipe; and
  a combined metal-interconnect layer coupled to the first portion of the image sensor and to the second portion of the image sensor, wherein the cavity is formed within the combined metal-interconnect layer between the first photodetector and the second photodetector to allow light to pass from the second photodetector, through the combined metal-interconnect layer to the first photodetector, the second photodetector positioned between the lens and the combined metal-interconnect layer;
a memory; and
a processor coupled to the memory and coupled to the image sensor.

13. The image processing device of claim 12, wherein:
the first photodetector is configured to receive at least a first portion of light from a light source; and
the second photodetector is configured to receive at least a second portion of the light from the light source.

14. The image processing device of claim 13, wherein:
the first photodetector is configured to convert the first portion of light into a first electrical signal;
the second photodetector is configured to convert the second portion of the light into a second electrical signal; and
the combined metal-interconnect layer is configured to drive the first electrical signal and the second electrical signal to the processor.

15. The image processing device of claim 14, wherein the image sensor is arranged such that, when the second portion of the image sensor is proximal to the light source, the at least second portion of the light passes through the second portion of the image sensor before the at least first portion of the light passes through the first portion of the image sensor.

16. The image processing device of claim 14, wherein:
the first portion of the light comprises at least one of infrared light or near-infrared light; and
the second portion of the light comprises visible light.

17. The image processing device of claim 14, wherein the memory includes processor-executable instructions that, when executed by the processor, cause the processor to perform operations comprising:
generating a first digital signal from the first electrical signal;
generating a second digital signal from the second electrical signal; and
generating a combined digital signal from the first digital signal and the second digital signal.

18. The image processing device of claim 17, wherein the memory includes processor-executable instructions that, when executed by the processor, cause the processor to perform operations further comprising generating a digital image based at least in part on the combined digital signal.

19. The image sensor of claim 1, wherein the combined metal-interconnect layer configured to receive electronic signals from the first and second photodetectors.

20. The image sensor of claim 1, further comprising a first epitaxial layer and a second epitaxial layer, wherein the first epitaxial layer includes the first photodetector, and the second epitaxial layer includes the second photodetector.

21. The image sensor of claim 20, wherein the second epitaxial layer is positioned between the lens and the second metal inter-connect layer.

22. The image sensor of claim 21, further comprising a substrate positioned immediately below the first epitaxial layer.

23. The image sensor of claim 21, wherein the first epitaxial layer is positioned between the first metal inter-connect layer and the substrate.

24. The image sensor of claim 1, wherein the first and second metal-interconnect layers are physically coupled together so as to be in electrical contact.

25. The image sensor of claim 1, wherein the first metal-interconnect layer directly adjoins the second metal inter-connect layer.

26. The image processing device of claim 12, wherein the combined metal-interconnect layer configured to receive electronic signals from the first and second photodetectors.

27. The image processing device of claim 12, further comprising a first epitaxial layer and a second epitaxial layer, wherein the first epitaxial layer includes the first photodetector, and the second epitaxial layer includes the second photodetector.

28. The image processing device of claim 27, wherein the second epitaxial layer is positioned between the lens and the combined metal inter-connect layer.

29. The image processing device of claim 27, further comprising a substrate positioned immediately below the first epitaxial layer.

30. The image processing device of claim 12, wherein the first metal-interconnect layer directly adjoins the second metal interconnect layer.

\* \* \* \* \*